United States Patent
Yuan

(10) Patent No.: US 8,154,940 B2
(45) Date of Patent: Apr. 10, 2012

(54) METHOD OF REDUCING CURRENT OF MEMORY IN SELF-REFRESHING MODE AND RELATED MEMORY

(75) Inventor: Der-Min Yuan, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 12/901,569

(22) Filed: Oct. 10, 2010

(65) Prior Publication Data

US 2011/0026352 A1 Feb. 3, 2011

Related U.S. Application Data

(62) Division of application No. 12/256,448, filed on Oct. 22, 2008, now Pat. No. 7,843,754.

(30) Foreign Application Priority Data

Dec. 17, 2007 (TW) ................................ 96148241 A

(51) Int. Cl.
*G11C 7/00* (2006.01)
*G11C 5/14* (2006.01)

(52) U.S. Cl. .............. 365/222; 365/189.09; 365/189.11; 365/227; 365/228

(58) Field of Classification Search .................. 365/222, 365/189.09, 189.11, 227, 228
See application file for complete search history.

(56) References Cited

U.S. PATENT DOCUMENTS

| | | | |
|---|---|---|---|
| 5,654,930 A * | 8/1997 | Yoo et al. | 365/222 |
| 6,046,956 A | 4/2000 | Yabe | |
| 6,665,225 B2 | 12/2003 | Tsujino | |
| 6,809,986 B2 | 10/2004 | Kim | |
| 7,663,931 B2 * | 2/2010 | Lee et al. | 365/185.23 |
| 7,843,754 B2 * | 11/2010 | Yuan | 365/222 |
| 2006/0103434 A1 * | 5/2006 | Okamoto et al. | 327/77 |
| 2007/0147153 A1 * | 6/2007 | Schneider et al. | 365/222 |
| 2008/0037358 A1 * | 2/2008 | Yabuuchi et al. | 365/230.06 |

* cited by examiner

*Primary Examiner* — Ly D Pham
(74) *Attorney, Agent, or Firm* — Winston Hsu; Scott Margo

(57) ABSTRACT

The present invention provides a method of reducing current of a memory in a self-refreshing mode and a related memory. The memory includes a word line driver and a controller, and the word line driver includes a transistor. The transistor has a control terminal, a first terminal coupled to a word line, and a second terminal. The method includes: after the memory enters the self-refreshing mode: controlling a voltage difference between the control terminal and the second terminal to correspond to a first value during a self-refreshing operation period; and controlling a voltage difference between the control terminal and the second terminal to correspond to a second value smaller than the first value during a non self-refreshing operation period.

5 Claims, 8 Drawing Sheets

METHOD OF REDUCING CURRENT OF MEMORY IN SELF-REFRESHING MODE AND RELATED MEMORY

CROSS REFERENCE TO RELATED APPLICATIONS

This divisional application claims the benefit of co-pending U.S. patent application Ser. No. 12/256,448, filed on Oct. 22, 2008 and included herein by reference.

BACKGROUND OF THE INVENTION

1. Field of the Invention

The present invention relates to a method of reducing current of a memory in a self-refreshing mode and a related memory, and more particularly, to a method of reducing current of a DRAM in a self-refreshing mode and a related DRAM.

2. Description of the Prior Art

Please refer to FIG. 1. FIG. 1 shows a diagram of a local word line driver 10 in a DRAM (not shown). As shown in FIG. 1, the local word line driver 10 includes transistors P2, N3, N4, wherein Vpp, Vlow, and Vr are all voltage sources, and the local word line driver 10 is coupled to a word line WL. In the prior art, an initial voltage level of the voltage source Vpp is 3V, an initial voltage level of the voltage source Vlow is −0.6V, and an initial voltage level of the voltage source Vr is 1.8V.

After the DRAM enters a self-refreshing mode, the voltage difference between the gate terminal and the drain terminal of the transistor P2 will be held at 3.6V constantly, i.e. the voltage level of the voltage source Vpp is held at 3V constantly, and the voltage level of the voltage source Vlow is held at −0.6V constantly. Thus, there will be gate induced drain leakage (GIDL), causing a problem of excessive self-refreshing current.

SUMMARY OF THE INVENTION

It is therefore one of the objectives of the present invention to provide a method of reducing current of a memory in a self-refreshing mode and a related memory to solve the above problem.

According to an embodiment of the present invention, a method of reducing current of a memory in a self-refreshing mode is disclosed. The memory includes a word line driver, and the word line driver includes a transistor. The transistor has a control terminal, a first terminal coupled to a word line, and a second terminal. The method includes: after the memory enters the self-refreshing mode: controlling a voltage difference between the control terminal and the second terminal to correspond to a first value during a self-refreshing operation period; and controlling a voltage difference between the control terminal and the second terminal to correspond to a second value smaller than the first value during a non self-refreshing operation period.

According to an embodiment of the present invention, a memory is disclosed. The memory comprising: a word line driver, comprising a transistor having a control terminal, a first terminal coupled to a word line, and a second terminal; and a controller, for controlling a voltage difference between the control terminal and the second terminal to correspond to a first value during a self-refreshing operation period after the memory enters a self-refreshing mode, and controlling a voltage difference between the control terminal and the second terminal to correspond to a second value smaller than the first value during a non self-refreshing operation period after the memory enters the self-refreshing mode.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a method of reducing current of a DRAM in a self-refreshing mode, and this document will describe several exemplary embodiments that apply the method of the present invention. A person of average skill in the pertinent art should understand, however, that the present invention can be applied to various types of memories and is not limited to the particular embodiments described in the following paragraphs or to the particular manner in which any features of such embodiments are implemented.

In general, the method of the present invention can be applied to all kinds of memories. A method applied to the DRAM is disclosed in this document. This is only for illustrative purposes, however, and is not meant to be a limitation of the present invention. In addition, under conditions of not affecting the technical disclosure of the present invention, the DRAM including a local word line driver will be used in this document as an example to illustrate the operation principles of the method according to the present invention.

Figure 2:
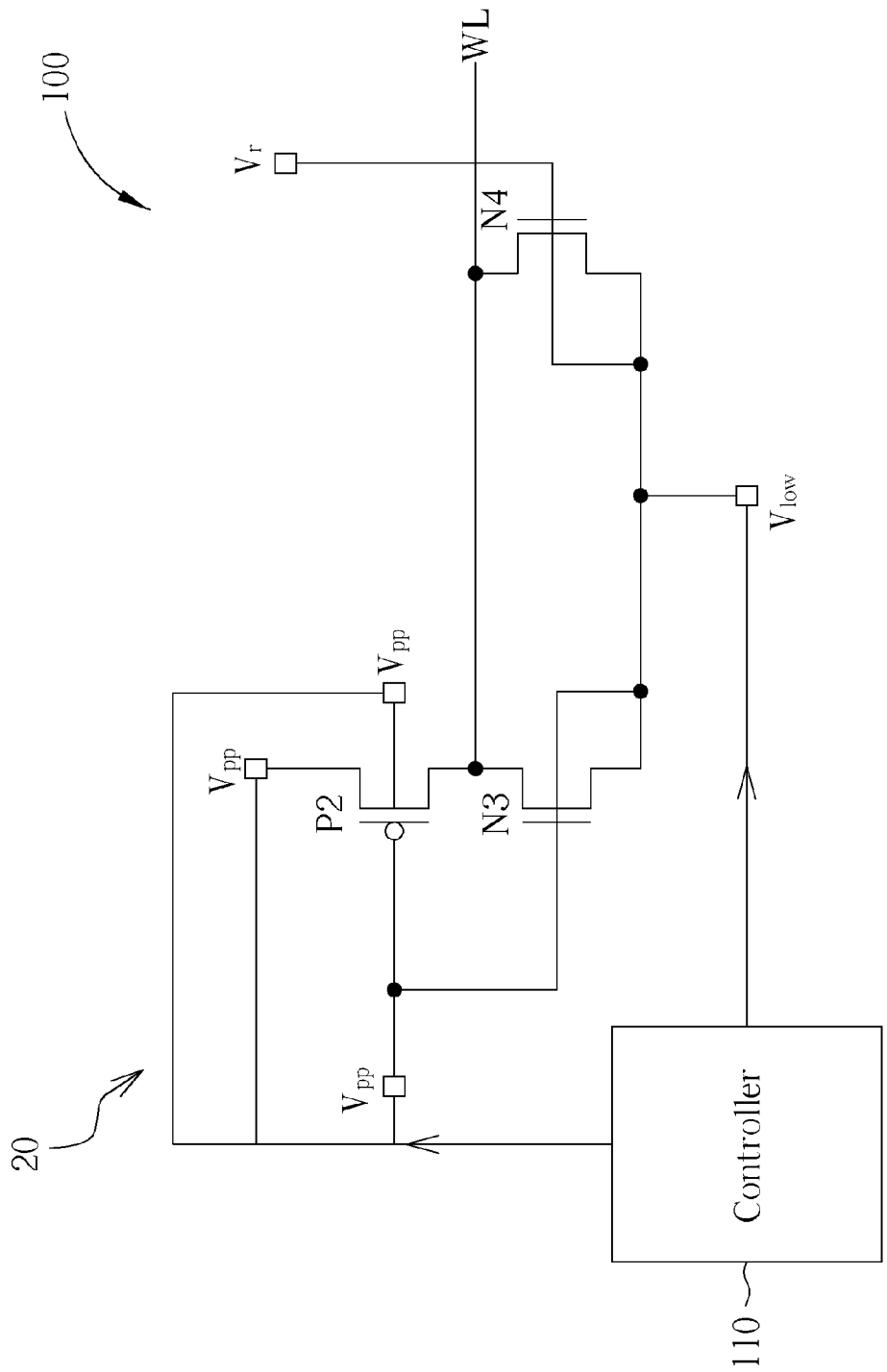
FIG. 2 shows a diagram of a DRAM in accordance with an embodiment of the present invention.

Please refer to FIG. 2. FIG. 2 shows a diagram of a DRAM 20 in accordance with a first embodiment of the present invention. As shown in FIG. 2, DRAM 20 comprises a local word line driver 100 and a controller 110, and the local word line driver 100 comprises transistors P2, N3, N4, wherein Vpp, Vlow, and Vr are all voltage sources. In this embodiment, an initial voltage level of the voltage source Vpp is 3V, an initial voltage level of the voltage source Vlow is −0.6V, and an initial voltage level of the voltage source Vr is 1.8V.

After the DRAM 20 enters a self-refreshing mode, the method of the present invention will use the controller 110 to control a voltage difference between the gate terminal and the drain terminal of the transistor P2 to correspond to a first value (such as 3.6V) during a self-refreshing operation period, i.e. hold the voltage level of the voltage source Vpp at 3V and hold the voltage level of the voltage source Vlow at −0.6V. Next, the method of the present invention will use the controller 110 to control a voltage difference between the gate terminal and the drain terminal of the transistor P2 to correspond to a second value (such as 3.3V) smaller than the first value during a non self-refreshing operation period, i.e. reduce the voltage difference between the voltage source Vpp and the voltage source Vlow from 3.6V to 3.3V.

Figure 1:
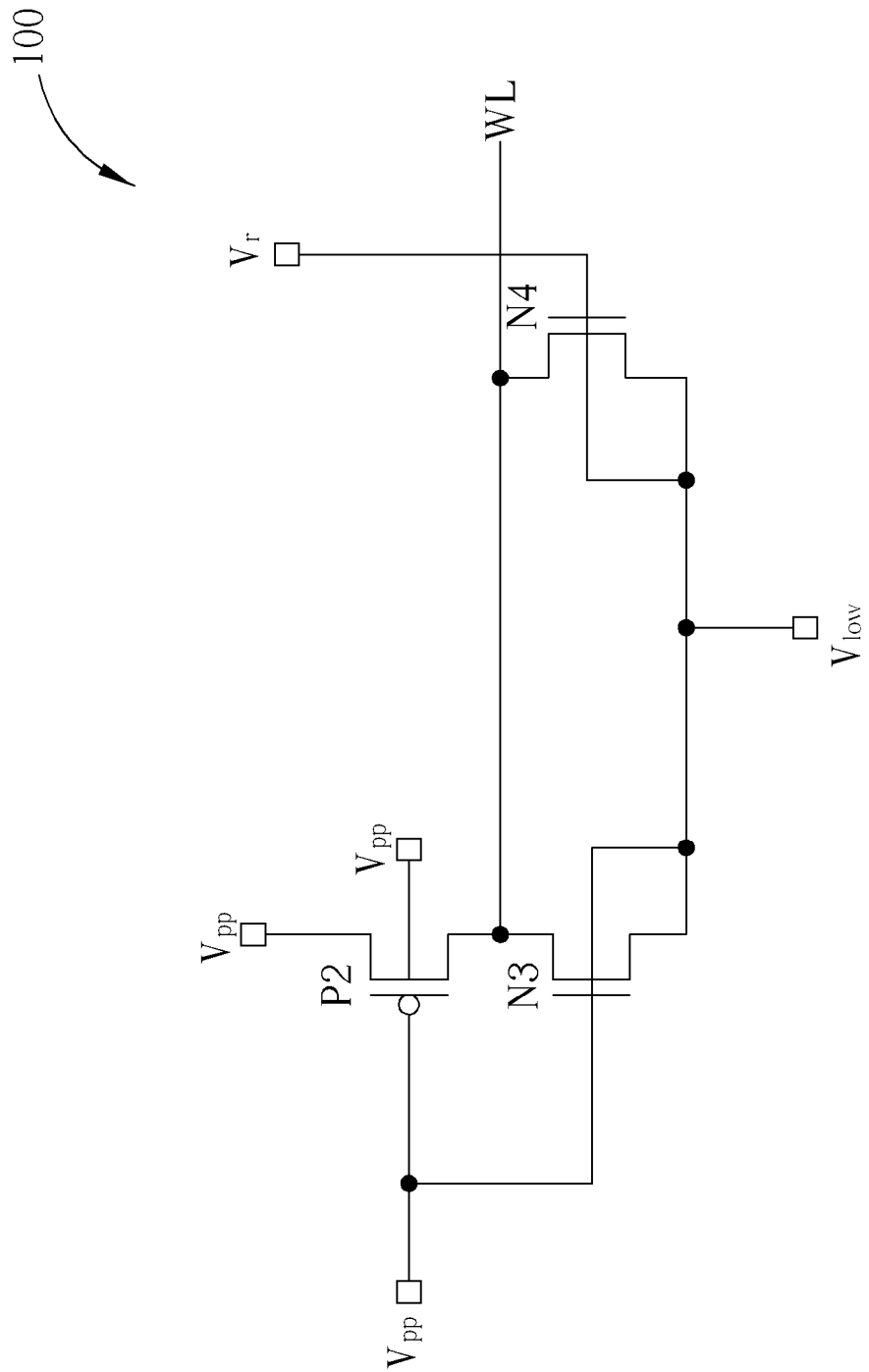
FIG. 1 shows a diagram of a local word line driver in a DRAM.
Figure 3:
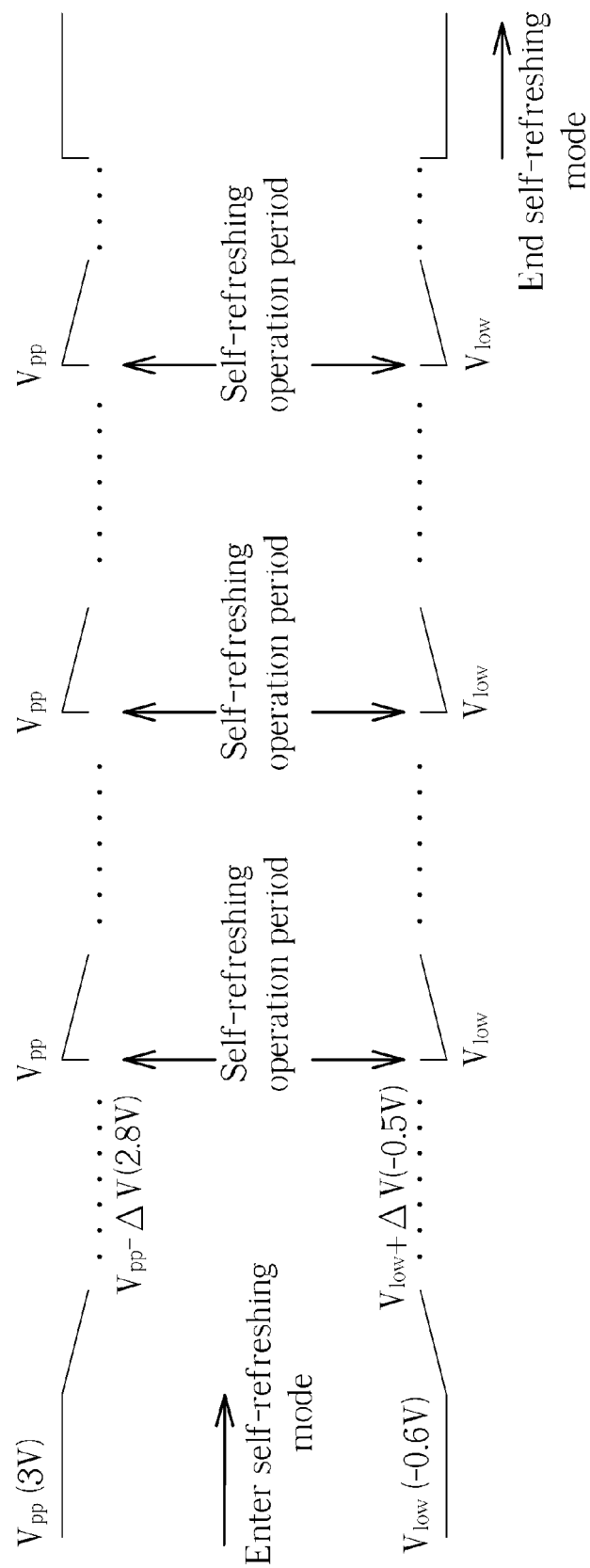
FIG. 3 shows a diagram of a method of reducing current of the DRAM in a self-refreshing mode in accordance with a first embodiment of the present invention.
Figure 4:
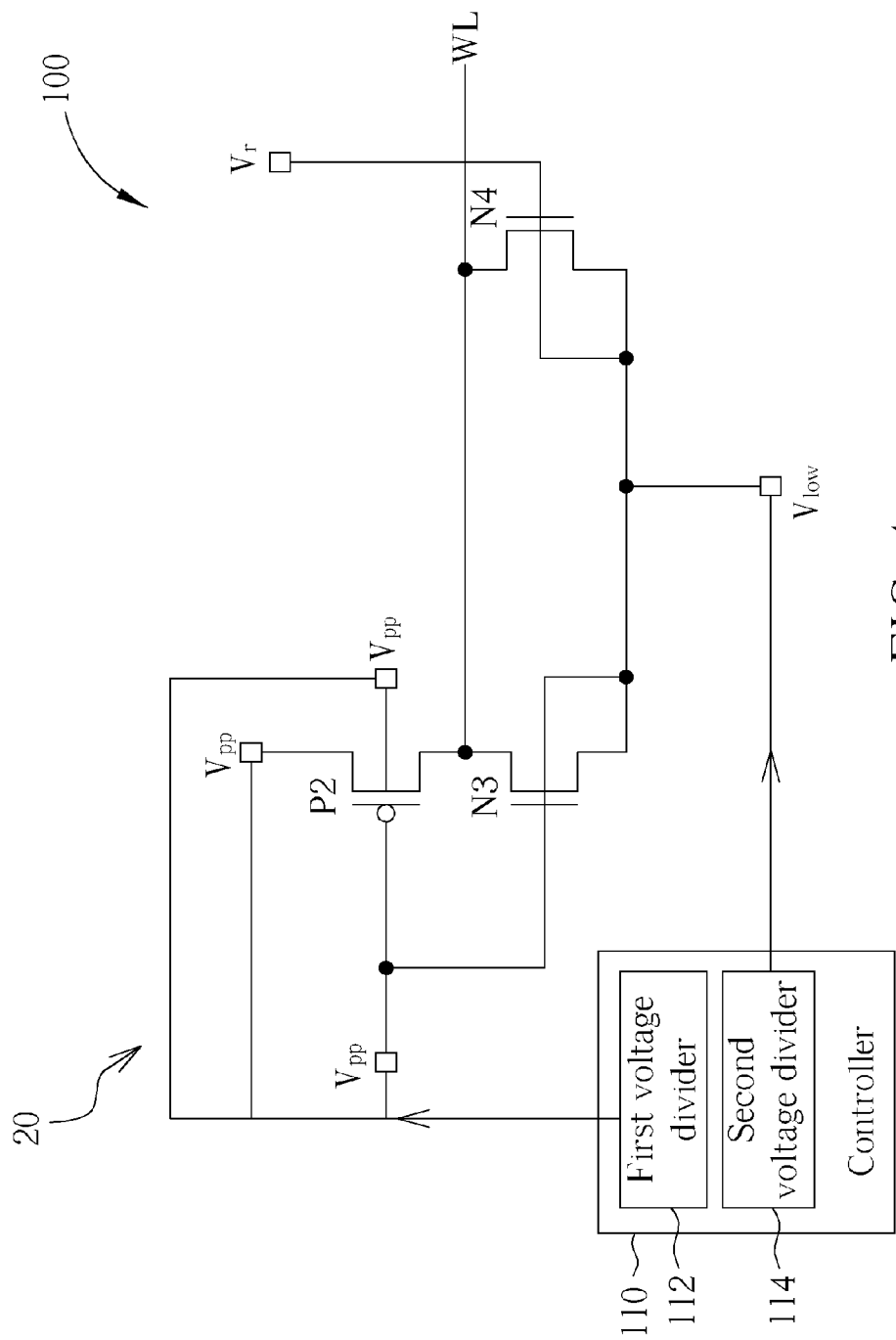
FIG. 4 shows another diagram of the DRAM.

Please refer to FIG. 3. FIG. 3 shows a diagram of a method of reducing current of the DRAM 20 in the self-refreshing mode in accordance with a first embodiment of the present invention. As shown in FIG. 3, after the DRAM 20 enters the self-refreshing mode, the method of the first embodiment in the present invention will gradually decrease the voltage level of the voltage source Vpp to 2.8V, and gradually increase the voltage level of the voltage source Vlow to −0.5V during the non self-refreshing operation period. In addition, the controller 110 in FIG. 1 can comprise a first voltage divider 112 for decreasing the voltage level of the voltage source Vpp, and a second voltage divider 114 for increasing the voltage level of the voltage source Vlow as shown in FIG. 4. Please note that the above embodiment is only for illustrative purposes and is not meant to be a limitation of the present invention.

Figure 5:
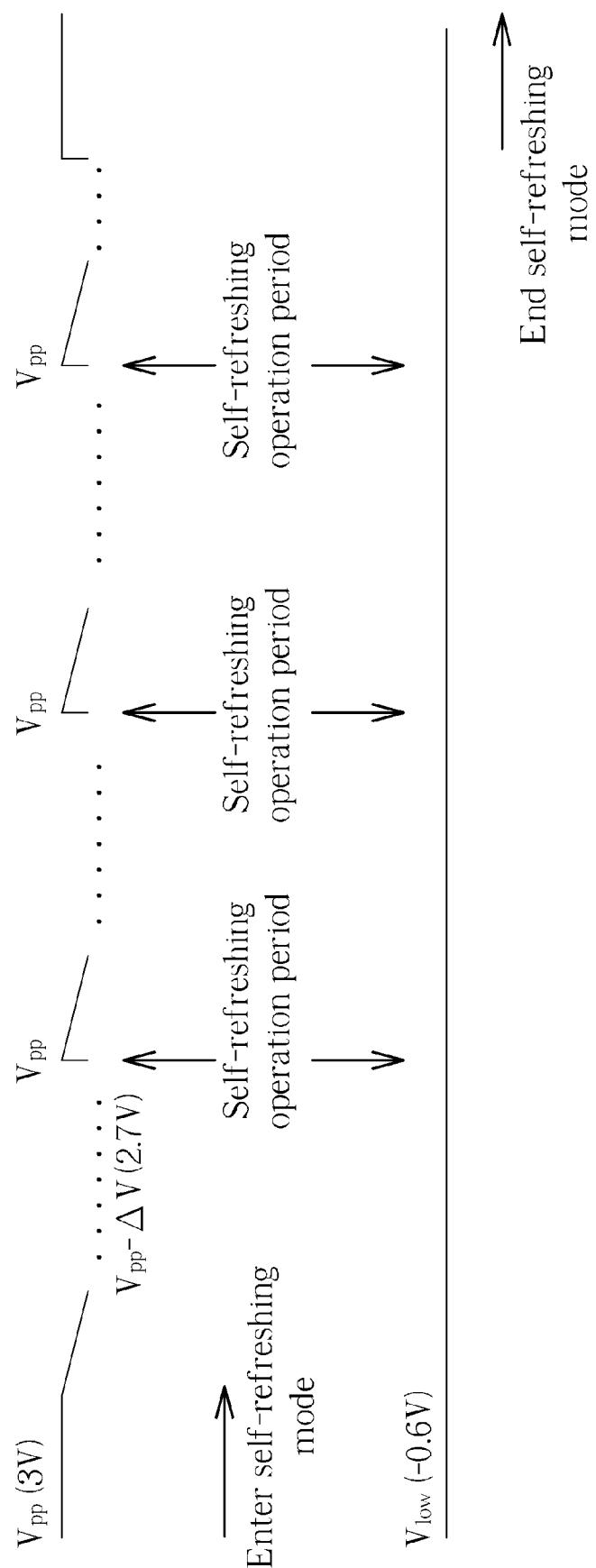
FIG. 5 shows a diagram of a method of reducing current of the DRAM in the self-refreshing mode in accordance with a second embodiment of the present invention.
Figure 6:
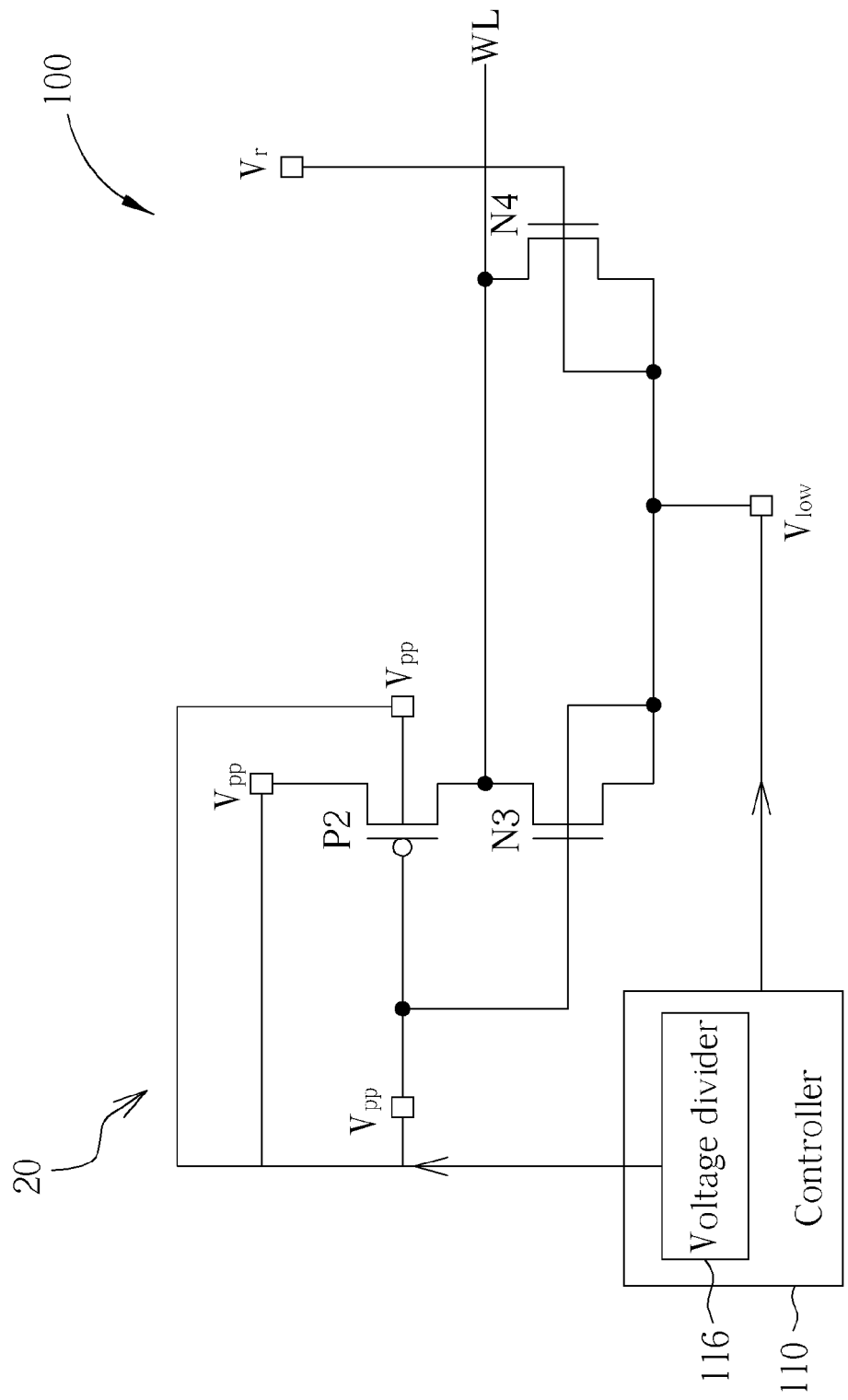
FIG. 6 shows another diagram of the DRAM.

Please refer to FIG. 5. FIG. 5 shows a diagram of a method of reducing current of the DRAM 20 in the self-refreshing mode in accordance with a second embodiment of the present invention. As shown in FIG. 5, after the DRAM 20 enters the self-refreshing mode, the method of the second embodiment will gradually decrease the voltage level of the voltage source Vpp to 2.7V, and hold the voltage level of the voltage source Vlow at −0.6V. In addition, the controller 110 in FIG. 1 can comprise a voltage divider 116 for decreasing the voltage level of the voltage source Vpp as shown in FIG. 6. Please note that the above embodiment is only for illustrative purposes and is not meant to be a limitation of the present invention.

Figure 7:
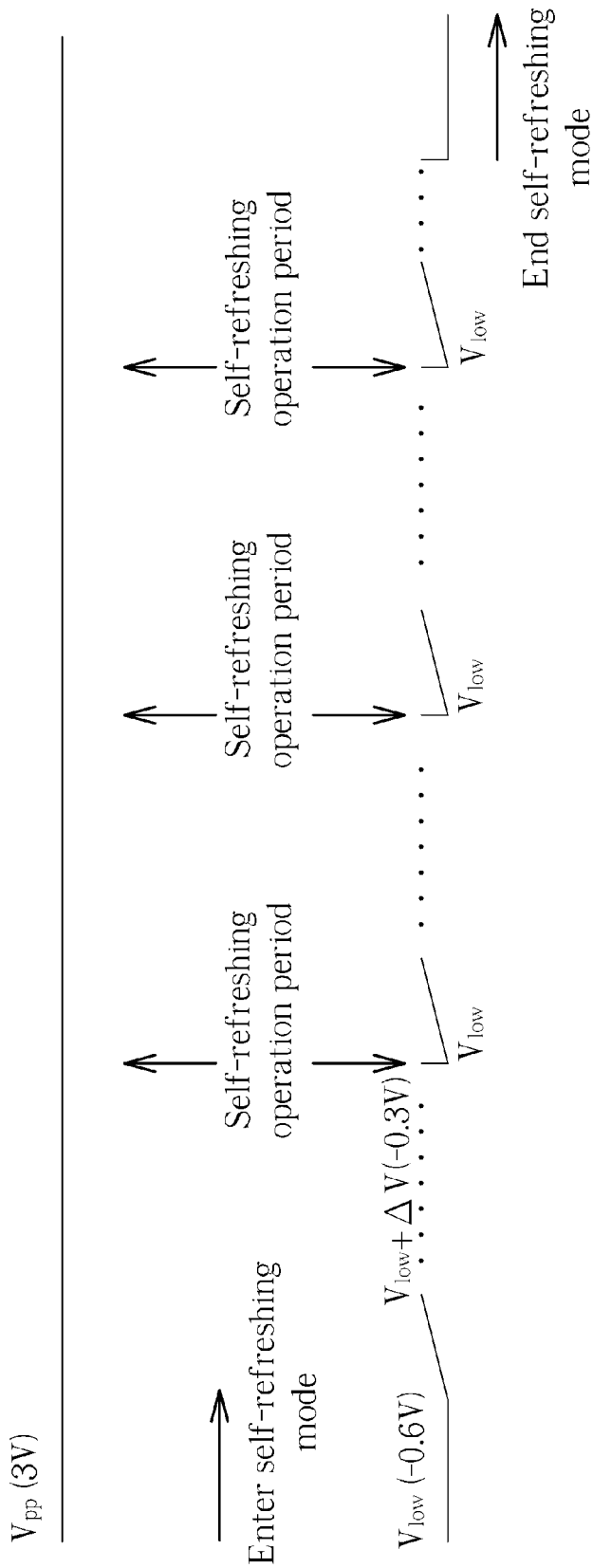
FIG. 7 shows a diagram of a method of reducing current of the DRAM in the self-refreshing mode in accordance with a third embodiment of the present invention.
Figure 8:
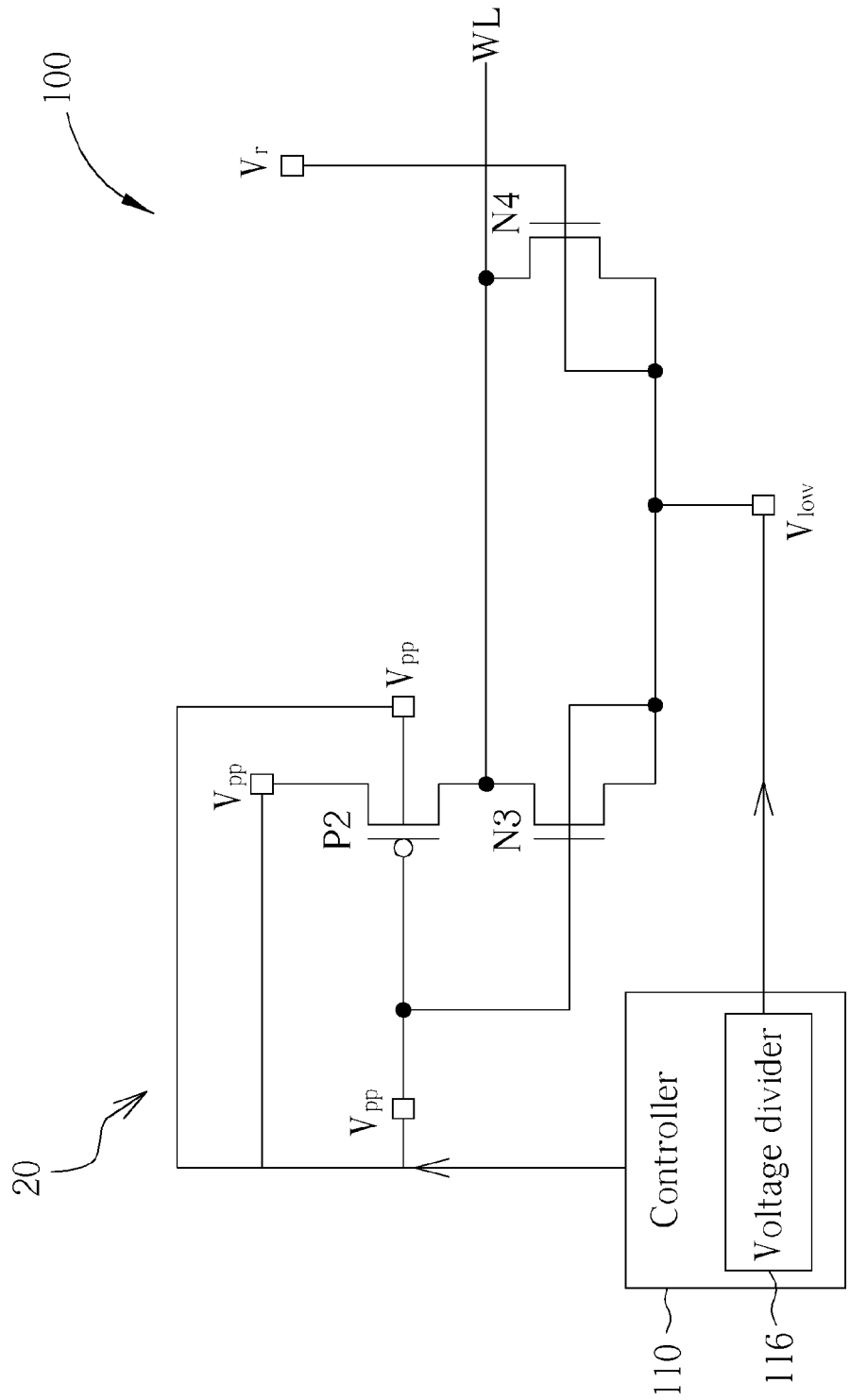
FIG. 8 shows another diagram of the DRAM.

Please refer to FIG. 7. FIG. 7 shows a diagram of a method of reducing current of the DRAM 20 in the self-refreshing mode in accordance with a third embodiment of the present invention. As shown in FIG. 7, after the DRAM 20 enters the self-refreshing mode, the method of the third embodiment will hold the voltage level of the voltage source Vpp at 3V, and gradually increase the voltage level of the voltage source Vlow to −0.5V during the non self-refreshing operation period. In addition, the controller 110 in FIG. 1 can comprise a voltage divider 118 for increasing the voltage level of the voltage source Vlow as shown in FIG. 8. Please note that the above embodiment is only for illustrative purposes and is not meant to be a limitation of the present invention.

Briefly summarized, the method and the related memory disclosed in the present invention can reduce the voltage difference between the gate terminal and the drain terminal of the transistor P2 in the local word line driver 100 during the non self-refreshing operation period after the DRAM 20 enters the self-refreshing mode. Thus, the gate induced drain leakage (GIDL) will be greatly decreased, and the self-refreshing current of the DRAM 20 can be reduced.

Those skilled in the art will readily observe that numerous modifications and alterations of the device and method may be made while retaining the teachings of the invention.

What is claimed is:

1. A method of reducing current of a memory in a self-refreshing mode, the memory including a word line driver, the word line driver including a transistor having a control terminal, a first terminal, and a second terminal coupled to a word line, the method comprising:
   after the memory enters the self-refreshing mode:
      controlling a voltage difference between the control terminal and the second terminal to correspond to a first value during a self-refreshing operation period; and
      controlling a voltage difference between the control terminal and the second terminal to correspond to a second value smaller than the first value during a non self-refreshing operation period.

2. The method of claim 1, wherein the step of controlling the voltage difference between the control terminal and the second terminal to correspond to the second value smaller than the first value comprises:
   increasing a voltage level at the second terminal of the transistor; and
   holding a voltage level at the control terminal of the transistor.

3. A memory, comprising:
   a word line driver, comprising a transistor having a control terminal, a first terminal, and a second terminal coupled to a word line; and
   a controller, for controlling a voltage difference between the control terminal and the second terminal to correspond to a first value during a self-refreshing operation period after the memory enters a self-refreshing mode, and controlling a voltage difference between the control terminal and the second terminal to correspond to a second value smaller than the first value during a non self-refreshing operation period after the memory enters the self-refreshing mode.

4. The memory of claim 3, wherein the controller controls the voltage difference between the control terminal and the second terminal to correspond to the second value smaller than the first value by increasing a voltage level at the second terminal of the transistor and holding a voltage level at the control terminal of the transistor.

5. The memory of claim 4, wherein the controller comprises a voltage divider for increasing the voltage level at the control terminal of the transistor.

* * * * *